(12) United States Patent
Yin

(10) Patent No.: US 11,509,335 B2
(45) Date of Patent: Nov. 22, 2022

(54) HIGH ISOLATION RADIO FREQUENCY MULTIPLEXER

(71) Applicant: NXP USA, INC., Austin, TX (US)

(72) Inventor: Yi Yin, Munich (DE)

(73) Assignee: NXP USA, INC., Austin, TX (US)

( * ) Notice: Subject to any disclaimer, the term of this patent is extended or adjusted under 35 U.S.C. 154(b) by 209 days.

(21) Appl. No.: 16/941,670

(22) Filed: Jul. 29, 2020

(65) Prior Publication Data

US 2022/0038121 A1 Feb. 3, 2022

(51) Int. Cl.
*H04B 1/00* (2006.01)
*H04B 1/04* (2006.01)
*H04B 1/16* (2006.01)

(52) U.S. Cl.
CPC ......... *H04B 1/0057* (2013.01); *H04B 1/0483* (2013.01); *H04B 1/1607* (2013.01)

(58) Field of Classification Search
CPC ...... H04B 1/0057; H04B 1/0483; H04B 3/32; H04B 1/1607
See application file for complete search history.

(56) References Cited

U.S. PATENT DOCUMENTS

| | | | | |
|---|---|---|---|---|
| 6,563,374 B1* | 5/2003 | Jaussi | ................ | H03F 3/45183 327/563 |
| 6,720,818 B1 | 4/2004 | Liu et al. | | |
| 7,030,679 B2* | 4/2006 | Hopkins | ............. | H03F 3/45475 327/108 |
| 9,621,033 B2 | 4/2017 | Choy et al. | | |
| 9,985,016 B2 | 5/2018 | Choy et al. | | |
| 10,116,347 B1 | 10/2018 | Xu | | |
| 11,133,836 B1* | 9/2021 | Yin | ..................... | H04B 1/1607 |
| 2003/0090313 A1 | 5/2003 | Burgener et al. | | |
| 2010/0001351 A1 | 1/2010 | Zhang et al. | | |
| 2010/0117713 A1 | 5/2010 | Katoh et al. | | |
| 2013/0252562 A1 | 9/2013 | Hasson et al. | | |
| 2015/0091625 A1* | 4/2015 | He | ..................... | H03K 17/002 327/197 |
| 2017/0250723 A1 | 8/2017 | Srirattana | | |

FOREIGN PATENT DOCUMENTS

CN 105915203 A 8/2016

OTHER PUBLICATIONS

Non-final office action dated Apr. 13, 2021 in U.S. Appl. No. 16/930,747.

(Continued)

*Primary Examiner* — Khanh C Tran

(57) ABSTRACT

A radio frequency (RF) multiplexer circuit is provided. The multiplexer includes a first circuit coupled between a first input terminal and a first output terminal. The first circuit is configured and arranged to transfer a first RF signal coupled at the first input terminal to the first output terminal as a first output signal when a first control signal is at a first logic value. The multiplexer includes a second circuit coupled between a second input terminal and the first output terminal. The second circuit is configured and arranged to transfer a second RF signal coupled at the second input terminal to the first output terminal as a second output signal having a gain higher than the gain of the second RF signal when the first control signal is at a second logic value.

20 Claims, 3 Drawing Sheets

(56) References Cited

OTHER PUBLICATIONS

Talwalkar, N., "Integrated CMOS Transmit-Receive Switch Using LC-Tuned Substrate Bias for 2.4-GHz and 5.2-GHz Applications", IEEE Journal of Solid-State Circuits, vol. 39, No. 6, Jun. 2004.
Notice of Allowance dated Jul. 13, 2021 in U.S. Appl. No. 16/930,747.
"CBTL01023; 3.3 V, one differential channel, 2 : 1 multiplexer/demultiplexer switch for PCI Express Gen3"; Product data sheet; Rev. 1—Oct. 24, 2011.
Chien, J., "A 15-Gb/s 2:1 Multiplexer in 0.18-um CMOS", IEEE Microwave and Wireless Components Letters, vol. 16, No. 10, Oct. 2006.
Li, Q., "CMOS T/R Switch Design: Towards Ultra-Wideband and Higher Frequency", IEEE Journal of Solid-State Circuits, vol. 42, No. 3, Mar. 2007.
U.S. Appl. No. 16/930,747, filed Jul. 16, 2020, with a title of "High Isolation Radio Frequency Switch".

\* cited by examiner

HIGH ISOLATION RADIO FREQUENCY MULTIPLEXER

BACKGROUND

Field

This disclosure relates generally to electronic circuits, and more specifically, to a high isolation radio frequency multiplexer circuit.

Related Art

Today, many high performance RF and microwave communication devices, such as automotive radar devices for example, incorporate circuitry configured and arranged to handle and manipulate RF and microwave signals. However, such circuitry may experience signal leakage currents and excessive impedances resulting in high insertion losses and poor isolation. It is thus desirable to provide circuitry that accommodates RF and microwave signals while minimizing leakage current and impedances.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a radio frequency (RF) multiplexer circuit with high isolation and low impedance. The multiplexer circuit includes a first circuit portion and a second circuit portion coupled to a common output terminal pair. When the first circuit is enabled, the second circuit is disabled and a differential signal coupled at the input of the first circuit is transferred to the output terminal pair as a first differential output signal. When the second circuit is enabled, the first circuit is disabled and a differential signal coupled at the input of the second circuit is amplified as the signal is transferred to the output terminal pair as a second differential output signal. The second circuit is configured to generate the second differential output signal to have a predetermined gain higher than the gain of the first differential output signal. A network of shunt transistors in the first circuit are configured to short leakage signals to ground and improve isolation when the first circuit is disabled.

Figure 1:
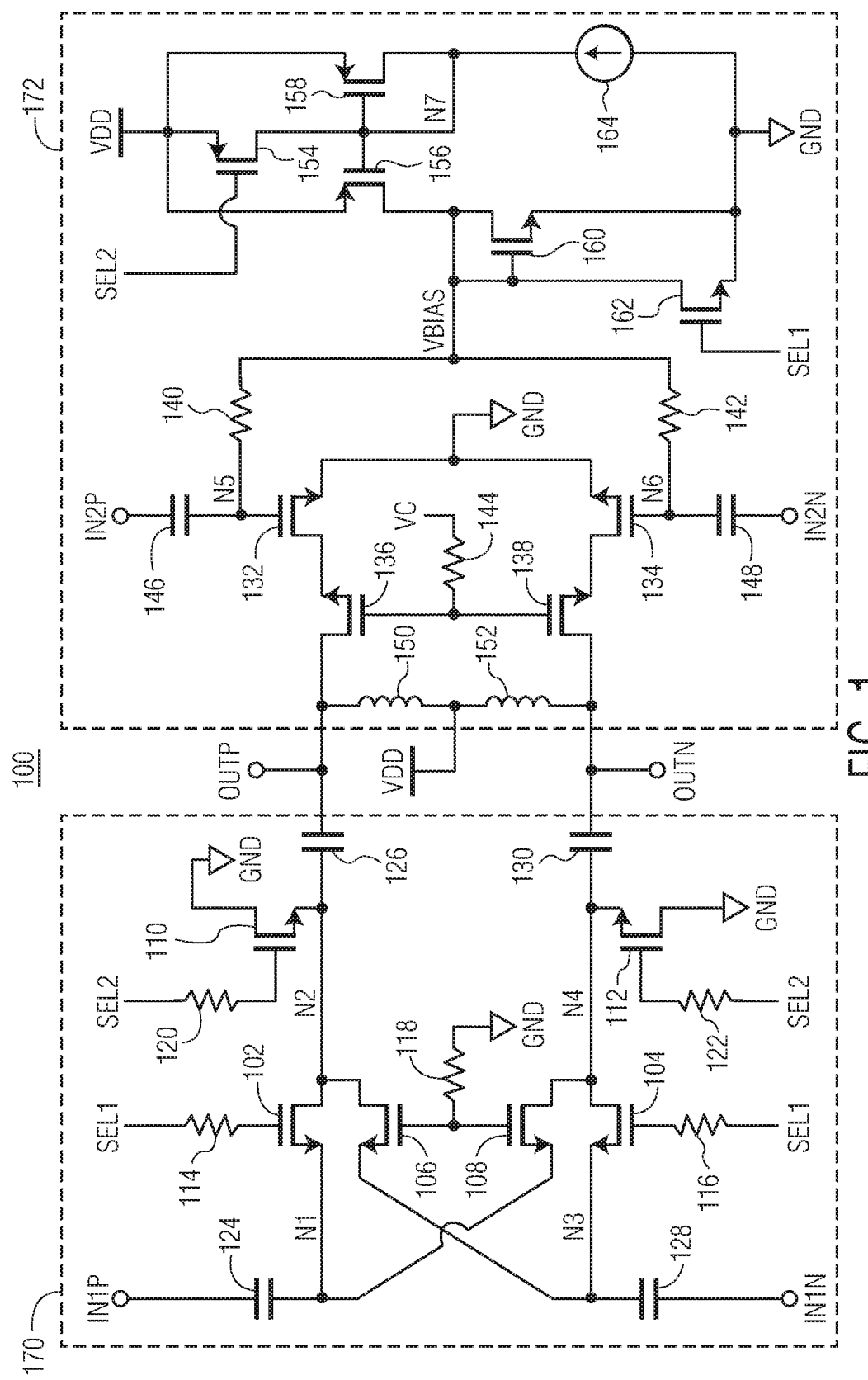
FIG. 1 illustrates, in simplified schematic diagram form, an example radio frequency multiplexer circuit in accordance with an embodiment.

FIG. 1 illustrates, in simplified schematic diagram form, an example radio frequency (RF) multiplexer circuit 100 in accordance with an embodiment. Multiplexer circuit 100 is implemented as an integrated circuit and has a first pair of input terminals labeled IN1P and IN1N for receiving a first differential input signal, a second pair of input terminals labeled IN2P and IN2N for receiving a second differential input signal, a pair of output terminals labeled OUTP and OUTN for providing a differential output signal, and select input terminals labeled SEL1 and SEL2 for receiving respective select control signals SEL1 and SEL2. In this embodiment, the SEL2 control signal is a complementary signal (e.g., inverse) of the SEL1 control signal. In this embodiment, the example implementation of multiplexer circuit 100 includes a first circuit portion 170 and a second circuit portion 172. For illustration purposes, transistors depicted in the first circuit portion 170 of FIG. 1 are shown as three-terminal devices (e.g., gate, drain, source). Corresponding bulk and body connections are shown in FIGS. 2A and 2B, 3A and 3B.

Multiplexer circuit 100 is characterized as a 2:1 multiplexer configured and arranged to transfer a first differential radio frequency (RF) signal coupled at the first input terminal pair to the output terminal pair when the SEL1 control signal is at a first state (e.g., logic high) and transfer a second differential RF signal coupled at the second input terminal pair to the output terminal pair when the SEL1 control signal is at a second state (e.g., logic low). When the SEL1 control signal is at the first state, the second circuit portion 172 is disabled, and when the SEL1 control signal is at the second state, the first circuit portion 170 is disabled. In this embodiment, the second differential RF signal is amplified as the signal is transferred to the output terminal pair when the SEL1 control signal is at the second state such that the corresponding differential output signal has a predetermined gain higher than the gain of the second differential RF signal. In this embodiment, the RF signal may have a frequency in a range of 3 kHz to 300 GHz. For example, the RF signal may be characterized as a microwave signal (e.g., 1 GHz to 100 GHz), a radar signal (e.g., 30 MHz to 130 GHz), a mmWave signal (e.g., 30 GHz to 300 GHz), and so on.

The first circuit 170 includes N-channel MOS transistors 102-112, resistors 114-122, and capacitors 124-130 coupled between the first input terminal pair (IN1P, IN1N) and the output terminal pair (OUTP, OUTN). A first signal path from the IN1P terminal to the OUTP terminal includes transistor 102 coupled in series with capacitors 124 and 126, and a second signal path from the IN1N terminal to the OUTN terminal includes transistor 104 coupled in series with capacitors 128 and 130. In this embodiment, transistors 102-104 are formed in a triple well fabrication process technology and configured with a floating double well structure having a resistor connected bulk bias supply (e.g., FIG. 2A, 2B). A first current electrode of transistor 102 is coupled at node N1 and a second current electrode of transistor 102 is coupled at node N2. A first current electrode of transistor 104 is coupled at node N3 and a second current electrode of transistor 104 is coupled at node N4. The SEL1 control signal line is coupled to control electrodes of transistors 102 and 104 by way of resistors 114 and 116 respectively. A first terminal of resistor 114 is connected to the SEL1 control signal line to receive the SEL1 control signal and a second terminal of resistor 114 is connected to the control electrode of transistor 102. A first terminal of resistor 116 is connected to the SEL1 control signal line to receive the SEL1 control signal and a second terminal of resistor 116 is connected to the control electrode of transistor 104. In some embodiments, transistors 102-104 may be implemented as bipolar junction transistors (BJTs).

The first input terminal pair is coupled at nodes N1 and N3 by way of capacitors 124 and 128 respectively. A first terminal of capacitor 124 is connected to the IN1P terminal to receive a first input signal and a second terminal of capacitor 124 is connected at node N1. A first terminal of capacitor 128 is connected to the IN1N terminal to receive a second input signal and a second terminal of capacitor 128 is connected at node N3. In this embodiment, the first input signal and the second input signal together are characterized as a differential input signal. The output terminal pair is coupled at nodes N2 and N4 by way of capacitors 126 and 130 respectively. A first terminal of capacitor 126 is connected to the OUTP terminal and a second terminal of capacitor 126 is connected at node N2. A first terminal of capacitor 130 is connected to the OUTN terminal and a second terminal of capacitor 130 is connected at node N4.

The transistors 106-112 serve as shunt circuitry configured to shunt leakage signals between the first signal path and the second signal path, for example, when the first circuit 170 is disabled (e.g., SEL1 at logic low). In this embodiment, transistors 106-112 are formed in the triple well fabrication process technology and configured with a floating single well structure (e.g., FIG. 3A, 3B).

A first current electrode of transistor 106 is coupled at node N2 and a second current electrode of transistor 106 is coupled at node N3. A first current electrode of transistor 108 is coupled at node N4 and a second current electrode of transistor 108 is coupled at node N1. Control electrodes of transistors 106 and 108 are coupled to a voltage supply terminal labeled GND by way of the resistor 118. In this embodiment, a ground voltage (e.g., 0 volts) is supplied at the GND supply terminal. A first terminal of resistor 118 is connected to the control electrode of transistors 106 and 108, and a second terminal of resistor 118 is connected to the GND supply terminal.

A first current electrode of transistor 110 is coupled at node N2 and a second current electrode of transistor 110 is coupled to the GND supply terminal. A first current electrode of transistor 112 is coupled at node N4 and a second current electrode of transistor 112 is coupled to the GND supply terminal. The SEL2 control signal line is coupled to control electrodes of transistors 110 and 112 by way of resistors 120 and 122 respectively. A first terminal of resistor 120 is connected to the SEL2 control signal line to receive the SEL2 control signal and a second terminal of resistor 120 is connected to the control electrode of transistor 110. A first terminal of resistor 122 is connected to the SEL2 control signal line to receive the SEL2 control signal and a second terminal of resistor 122 is connected to the control electrode of transistor 112.

The second circuit 172 includes an amplifier portion and a bias generation portion. The amplifier portion includes N-channel MOS transistors 132-138, resistors 140-144, capacitors 146-148 and inductors 150-152 coupled between the second input terminal pair (IN2P, IN2N) and the output terminal pair (OUTP, OUTN). A first signal path from the IN2P terminal to the OUTP terminal includes a cascode configuration of transistors 132 and 136 coupled with capacitor 146, and a second signal path from the IN2N terminal to the OUTN terminal includes a cascode configuration of transistors 134 and 138 coupled with capacitor 148. A first current electrode of transistor 132 is coupled to the GND supply terminal. A second current electrode of transistor 132 is coupled to a first current electrode of transistor 136 and a second current electrode of transistor 136 is coupled at the OUTP terminal. A first current electrode of transistor 134 is coupled to the GND supply terminal. A second current electrode of transistor 134 is coupled to a first current electrode of transistor 138 and a second current electrode of transistor 138 is coupled at the OUTN terminal. Control electrodes of transistors 132 and 134 are coupled to a bias voltage supply terminal labeled VBIAS by way of the resistors 140 and 142 respectively. In this embodiment, a bias voltage (e.g., approximately VGS) is supplied at the VBIAS supply terminal. A first terminal of resistor 140 is connected to the VBIAS terminal to receive the VBIAS voltage signal and a second terminal of resistor 140 is connected to the control electrode of transistor 132 at node N5. A first terminal of resistor 142 is connected to the VBIAS terminal to receive the VBIAS voltage signal and a second terminal of resistor 142 is connected to the control electrode of transistor 134 at node N6.

The second input terminal pair is coupled at nodes N5 and N6 by way of capacitors 146 and 148 respectively. A first terminal of capacitor 146 is connected to the IN2P terminal to receive a third input signal and a second terminal of capacitor 146 is connected at node N5. A first terminal of capacitor 148 is connected to the IN2N terminal to receive a fourth input signal and a second terminal of capacitor 148 is connected at node N6. In this embodiment, the third input signal and the fourth input signal together are characterized as a differential input signal. Control electrodes of transistors 136 and 138 are coupled to a bias voltage supply terminal labeled VC by way of the resistor 144. In this embodiment, a cascode bias voltage (e.g., approximately VGS+VDS) is supplied at the VC supply terminal. A first terminal of resistor 144 is connected to the control electrode of transistors 136 and 138, and a second terminal of resistor 144 is connected to the VC supply terminal. The output terminal pair is coupled to the VDD supply terminal by way of the inductors 150 and 152 respectively. A first terminal of inductor 150 is connected to the VDD supply terminal and a second terminal of inductor 150 is connected to the OUTP terminal. A first terminal of inductor 152 is connected to the VDD supply terminal and a second terminal of inductor 152 is connected to the OUTN terminal.

The bias generation portion includes P-channel MOS transistors 154-158, N-channel MOS transistors 160-162, and current source 164. The bias generation portion is configured and arranged to generate the VBIAS voltage provided at the VBIAS terminal when the second circuit 172 is enabled (e.g., SEL1 at logic low, SEL2 at logic high). A first current electrode of transistor 156 is coupled to the VDD supply terminal. A second current electrode of transistor 156 is coupled to a first current electrode and control electrode of transistor 160 and a first current electrode of transistor 162 at the VBIAS terminal. A first current electrode of transistor 158 is coupled to the VDD supply terminal and a second current electrode of transistor 158 is coupled to control electrodes of transistors 156 and 158, a first current electrode of transistor 154, and a first terminal of current source 164 at node N7. A second current electrode of transistor 154 is coupled to the VDD supply terminal and a control electrode of transistor 154 is coupled to the SEL2 control signal line to receive the SEL2 control signal. Second current electrodes of transistors 160 and 162 and a second terminal of current source 164 are coupled to the GND supply terminal. A control electrode of transistor 162 is coupled to the SEL1 control signal line to receive the SEL1 control signal. In this embodiment, transistors 154 and 162 are configured to serve as disable devices causing the bias generation portion and amplifier portion to be disabled when the first circuit 170 is enabled (e.g., SEL1 at logic high, SEL2 at logic low).

Figure 2A:
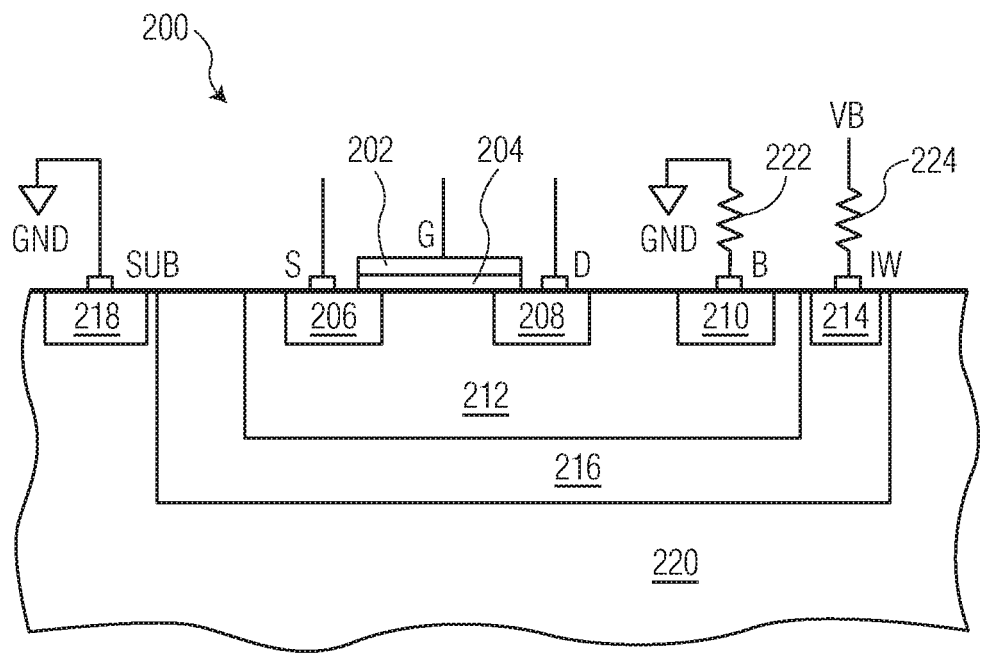
FIG. 2A illustrates, in a simplified cross-sectional view, an example N-channel transistor with a double well body formed in a triple well process technology in accordance with an embodiment.

FIG. 2A illustrates, in a simplified cross-sectional view, an example five-terminal N-channel transistor 200 with a double well body formed in a triple well process technology in accordance with an embodiment. In this embodiment, transistor 200 corresponds to transistors 102-104 depicted in FIG. 1. Transistor 200 is formed in an isolated P-well 212 and includes a gate electrode 202 labeled G formed on a gate dielectric 204. Gate electrode 202 typically includes a polysilicon material but may include any suitable conductive material. Gate dielectric 204 may be formed from any suitable dielectric material such as a grown or deposited oxide material. Transistor 200 includes an N+ region 206 formed as a first current electrode 206 labeled S and an N+ region 208 formed as a second current electrode 208 labeled D on opposing sides of gate electrode 202, forming a channel below the gate dielectric 204. Transistor 200 may include other aspects not shown in FIG. 2A such as a gate electrode contact, source/drain extension implants and/or sidewall spacers, and the like.

P+ well tie 210 provides connectivity between P-well body electrode contact labeled B and P-well body 212. A first body connection resistor 222 is configured to couple the body electrode B of transistor 200 to the GND supply terminal. P-well 212 of transistor 200 is formed within a surrounding body isolation N-well 216. The surrounding isolation N-well 216 is formed as a deep N-well or buried N-well implant with formed N-type doped or implanted wall portions surrounding the P-well 212. N+ well tie 214 provides connectivity between isolation N-well electrode contact labeled IW and isolation N-well 216. A second body connection resistor 224 is configured to couple the body isolation electrode IW of transistor 200 to a bias voltage supply terminal labeled VB. In this embodiment, a positive voltage such as an operating voltage of circuitry (e.g., VDD) may be provided at the VB supply terminal, for example. Isolation N-well 216 isolates body P-well 212 from the P-type substrate 220. P+ substrate tie 218 provides connectivity between substrate electrode contact labeled SUB and P− substrate 220. The gate electrode G, first and second current electrodes S and D (e.g., source and drain), isolated P-well body electrode B, and body isolation N-well electrode IW can be characterized as five terminals of transistor 200. In this embodiment, the term "electrode" may be used interchangeably with the term "terminal" when referring to transistor 200.

Figure 2B:
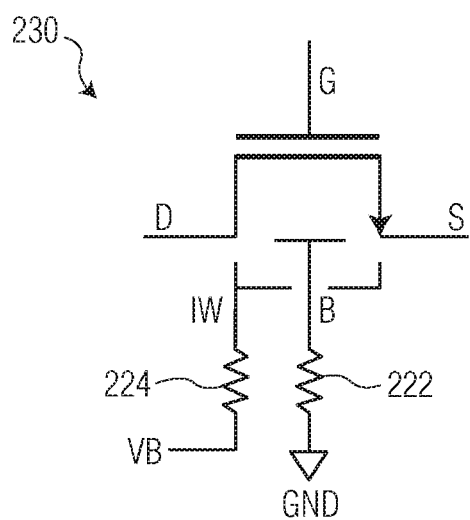
FIG. 2B illustrates, in simplified schematic diagram form, the example N-channel transistor of FIG. 2A with body connection circuit in accordance with an embodiment.

FIG. 2B illustrates, in simplified schematic diagram form, an example five-terminal N-channel transistor 230 with body connection circuit in accordance with an embodiment. In this embodiment, transistor 230 corresponds to the cross-sectional example five-terminal transistor 200 of FIG. 2A. The transistor 230 includes a first current electrode labeled S (e.g., source), a second current electrode labeled D (e.g., drain), and a control electrode labeled G (e.g., gate). The transistor 230 further includes a body electrode labeled B and a body isolation electrode labeled IW (e.g., isolation well). Each of electrodes S, D, G, B, and IW of transistor 230 correspond to respective electrodes S, D, G, B, and IW of the cross-sectional view of transistor 200. In this embodiment, the term "electrode" may be used interchangeably with the term "terminal" when referring to transistor 230.

The body connection circuit of the transistor 230 includes resistors 222 and 224 coupled to provide respective voltages to the body well 212 and the isolation well 216. A first terminal of resistor 222 is connected to the body electrode B and a second terminal of resistor 222 is connected to the GND supply terminal. A first terminal of resistor 224 is connected to the body isolation electrode IW and a second terminal of resistor 222 is connected to the VB supply terminal. For depiction of detailed body connections, the transistor 230 with the body connection circuit may be substituted for each of transistors 102-104 shown in FIG. 1.

In this embodiment, the transistor 230 may be characterized as a double-well (e.g., P-well 212 and isolation N-well 216) body floating transistor. For example, in operation when the first circuit 170 is enabled (e.g., SEL1 at logic high, SEL2 at logic low), the resistors 222 and 224 provide an open circuit during transfer of an RF signal through the first circuit 170 thus reducing insertion loss without affecting the impedance of the first circuit 170 while enabled. In this manner, the intrinsic diodes formed between source region 206 and body region 212, drain region 208 and body region 212, body region 212 and body isolation region 216, and body isolation region and substrate 220 are prevented from being turned on by large signals thus improving linearity.

Figure 3A:
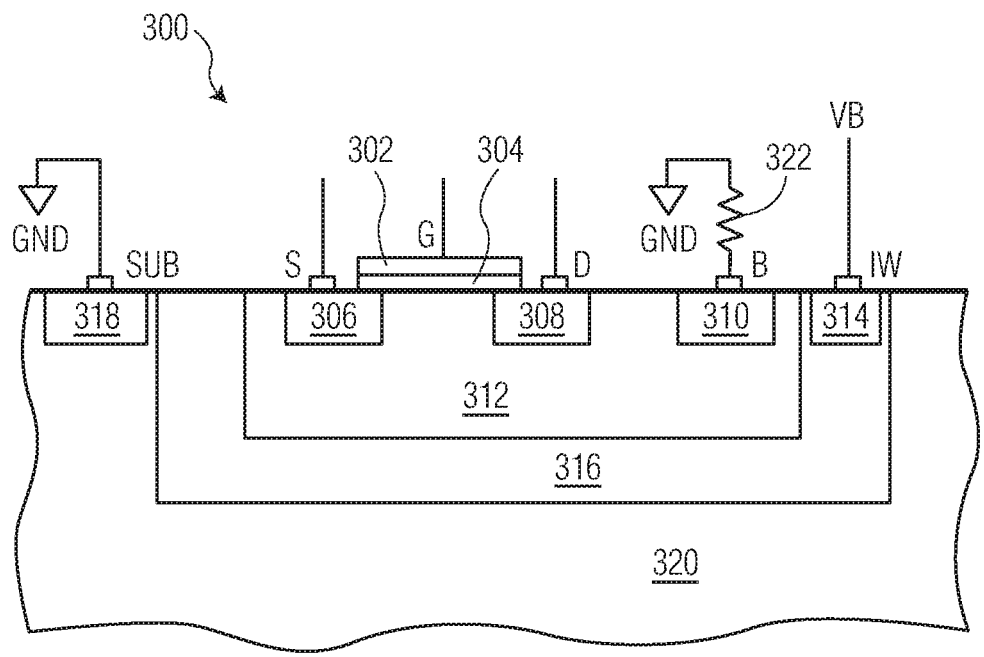
FIG. 3A illustrates, in a simplified cross-sectional view, an example N-channel transistor with a P-well body formed in a triple well process technology in accordance with an embodiment.

FIG. 3A illustrates, in a simplified cross-sectional view, an example five-terminal N-channel transistor 300 with a double well body formed in a triple well process technology in accordance with an embodiment. In this embodiment, transistor 300 corresponds to transistors 106-112 depicted in FIG. 1. Transistor 300 is formed in an isolated P-well 312 and includes a gate electrode 302 labeled G formed on a gate dielectric 304. Gate electrode 302 typically includes a polysilicon material but may include any suitable conductive material. Gate dielectric 304 may be formed from any suitable dielectric material such as a grown or deposited oxide material. Transistor 300 includes an N+ region 306 formed as a first current electrode 306 labeled S and an N+ region 308 formed as a second current electrode 308 labeled D on opposing sides of gate electrode 302, forming a channel below the gate dielectric 304. Transistor 300 may include other aspects not shown in FIG. 3A such as a gate electrode contact, source/drain extension implants and/or sidewall spacers, and the like.

P+ well tie 310 provides connectivity between P-well body electrode contact labeled B and P-well body 312. A body connection resistor 322 is configured to couple the body electrode B of transistor 300 to the GND supply terminal. P-well 312 of transistor 300 is formed within a surrounding body isolation N-well 316. The surrounding isolation N-well 316 is formed as a deep N-well or buried N-well implant with formed N-type doped or implanted wall portions surrounding the P-well 312. N+ well tie 314 provides connectivity between isolation N-well electrode contact labeled IW and isolation N-well 316. In this embodiment, the body isolation electrode IW of transistor 300 is directly connected to a bias voltage supply terminal labeled VB. Isolation N-well 316 isolates body P-well 312 from the P-type substrate 320. P+ substrate tie 318 provides connectivity between substrate electrode contact labeled SUB and P− substrate 320. The gate electrode G, first and second current electrodes S and D (e.g., source and drain), isolated P-well body electrode B, and body isolation N-well electrode IW can be characterized as five terminals of transistor 300. In this embodiment, the term "electrode" may be used interchangeably with the term "terminal" when referring to transistor 300.

Figure 3B:
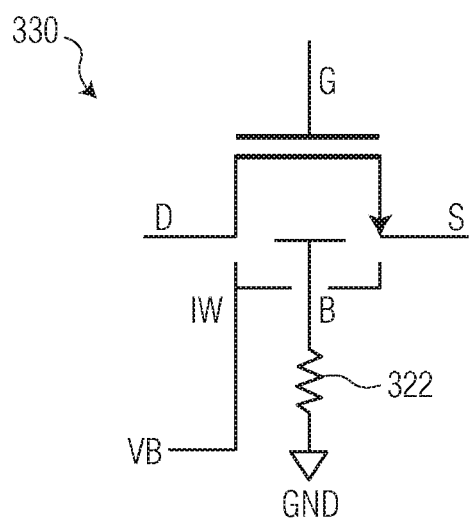
FIG. 3B illustrates, in simplified schematic diagram form, the example N-channel transistor of FIG. 3A with body connection circuit in accordance with an embodiment.

FIG. 3B illustrates, in simplified schematic diagram form, an example five-terminal N-channel transistor 330 with body connection circuit in accordance with an embodiment. In this embodiment, transistor 330 corresponds to the cross-sectional example five-terminal transistor 300 of FIG. 3A.

The transistor 330 includes a first current electrode labeled S (e.g., source), a second current electrode labeled D (e.g., drain), and a control electrode labeled G (e.g., gate). The transistor 330 further includes a body electrode labeled B and a body isolation electrode labeled IW (e.g., isolation well). Each of electrodes S, D, G, B, and IW of transistor 330 correspond to respective electrodes S, D, G, B, and IW of the cross-sectional view of transistor 300. In this embodiment, the term "electrode" may be used interchangeably with the term "terminal" when referring to transistor 330.

The body connection circuit of the transistor 330 includes resistor 322 coupled to provide the ground voltage to the body well 312 and a direct connection to provide the VB voltage to the isolation well 316. A first terminal of resistor 322 is connected to the body electrode B and a second terminal of resistor 322 is connected to the GND supply terminal. In this embodiment, the body isolation electrode IW is connected to the VB supply terminal. For depiction of detailed body connections, the transistor 330 with the body connection circuit may be substituted for each of transistors 106-112 shown in FIG. 1.

In this embodiment, the transistor 330 may be characterized as a single-well (e.g., P-well 312) body floating transistor. For example, when the first circuit 170 is disabled (e.g., SEL1 at logic low, SEL2 at logic high), shunt transistors 106-112 are configured to allow the resistor 322 to provide an open circuit for an RF leakage signal thus minimizing the Coff impedance of the first circuit 170. In this manner, insertion loss and linearity are improved.

Generally, there is provided, a multiplexer including a first circuit coupled between a first input terminal and a first output terminal, the first circuit configured and arranged to transfer a first radio frequency (RF) signal coupled at the first input terminal to the first output terminal as a first output signal when a first control signal is at a first logic value; and a second circuit coupled between a second input terminal and the first output terminal, the second circuit configured and arranged to transfer a second RF signal coupled at the second input terminal to the first output terminal as a second output signal when the first control signal is at a second logic value, the second output signal having a gain higher than the gain of the second RF signal. The first circuit may include a first transistor having a first current electrode coupled to the first input terminal, a second current electrode coupled to the first output terminal, and a control electrode coupled to receive the first control signal; and a second transistor having a first current electrode coupled to the second current electrode of the first transistor, a second current electrode coupled at a first supply terminal, and a control electrode coupled to receive a second control signal, the second control signal a complementary signal of the first control signal. The first transistor may be formed in a first isolation well coupled to a first bias voltage supply terminal by way of a resistor, and the second transistor may be formed in a second isolation well connected directly to the first bias voltage supply terminal. The first circuit may further include a first capacitor having a first terminal connected to the first input terminal and second terminal connected to the first current electrode of the first transistor; and a second capacitor having a first terminal connected to the second current electrode of the first transistor and second terminal connected to the first output terminal. The second circuit may include a third transistor having a first current electrode coupled at the first supply terminal and a control electrode coupled to the second input terminal; and a fourth transistor having a first current electrode coupled to a second current electrode of the third transistor, a second current electrode coupled to the first output terminal, and a control electrode coupled to a second bias supply terminal by way of a resistor. The second circuit may further include a first capacitor having a first terminal connected to the second input terminal and second terminal connected to the control electrode of the third transistor; and a first resistor having a first terminal connected to the control electrode of the third transistor and a second terminal connected to a third bias supply terminal. The second circuit may further include a first inductor having a first terminal connected to the second current electrode of the fourth transistor and second terminal connected to a second supply terminal. The second circuit may further include a fifth transistor having a first current electrode coupled to the control electrode of the third transistor, a second current electrode coupled at the first supply terminal, and a control electrode coupled to receive the first control signal. The first circuit may be further coupled between a third input terminal and a second output terminal, the first circuit further configured and arranged to transfer a third RF signal coupled at the third input terminal to the second output terminal as a third output signal when the first control signal is at the first logic value, the first RF signal and the third RF signal together are characterized as a first differential signal and the first output signal and the third output signal together are characterized as a first differential output signal; and the second circuit may be further coupled between a fourth input terminal and the second output terminal, the second circuit further configured and arranged to transfer a fourth RF signal coupled at the fourth input terminal to the second output terminal as a fourth output signal when the first control signal is at the second logic value, the fourth output signal having a gain higher than the gain of the fourth RF signal, the second RF signal and the fourth RF signal together are characterized as a second differential signal and the second output signal and the fourth output signal together are characterized as a second differential output signal.

In another embodiment, there is provided, a multiplexer including a first circuit coupled between a first input terminal and a first output terminal, the first circuit including a first transistor having a first current electrode coupled to the first input terminal, a second current electrode coupled to the first output terminal, and a control electrode coupled to receive a first control signal; and a second transistor having a first current electrode coupled to the second current electrode of the first transistor, a second current electrode coupled at a first supply terminal, and a control electrode coupled to receive a second control signal, the second control signal a complementary signal of the first control signal; and a second circuit coupled between a second input terminal and the first output terminal, the second circuit including a third transistor having a first current electrode coupled at the first supply terminal and a control electrode coupled to the second input terminal; and a fourth transistor having a first current electrode coupled to a second current electrode of the third transistor, a second current electrode coupled to the first output terminal, and a control electrode coupled to a first bias supply terminal by way of a first resistor. The first circuit may further include a first capacitor having a first terminal connected to the first input terminal and second terminal connected to the first current electrode of the first transistor; and a second capacitor having a first terminal connected to the second current electrode of the first transistor and second terminal connected to the first output terminal. The second circuit may further include a first capacitor having a first terminal connected to the second input terminal and second terminal connected to the control electrode of the third transistor; and a second resistor having a first terminal connected to the control electrode of the third transistor and a second terminal connected to a second bias supply terminal. The second circuit may further include a first inductor having a first terminal connected to the second current electrode of the fourth transistor and second terminal connected to a second supply terminal. The first circuit may be further coupled between a third input terminal and a second output terminal, the first circuit may further include a fifth transistor having a first current electrode coupled to the third input terminal, a second current electrode coupled to the second output terminal, and a control electrode coupled to receive the first control signal; and a sixth transistor having a first current electrode coupled to the second current electrode of the first transistor, a second current electrode coupled to the first current electrode of the fifth transistor, and a control electrode coupled to the first supply terminal by way of a second resistor. The second circuit may be further coupled between a fourth input terminal and the second output terminal, the second circuit may further include a seventh transistor having a first current electrode coupled at the first supply terminal and a control electrode coupled to the fourth input terminal; and an eighth transistor having a first current electrode coupled to a second current electrode of the seventh transistor, a second current electrode coupled to the second output terminal, and a control electrode coupled to the control electrode of the fourth transistor. The first transistor may be formed in a first isolation well coupled to a second bias voltage supply terminal by way of a second resistor, and the second transistor may be formed in a second isolation well connected directly to the second bias voltage supply terminal.

In yet another embodiment, there is provided, a multiplexer including a first circuit includes a first transistor having a first current electrode coupled to a first input terminal, a second current electrode coupled to a first output terminal, and a control electrode coupled to receive a first control signal; and a second transistor having a first current electrode coupled to the second current electrode of the first transistor, a second current electrode coupled at a first supply terminal, and a control electrode coupled to receive a second control signal, the second control signal a complementary signal of the first control signal; and a second circuit configured to transfer an RF signal coupled at a second input terminal to the first output terminal as an output signal having a gain higher than the gain of the RF signal based on the first control signal, the second circuit includes a third transistor having a first current electrode coupled at the first supply terminal and a control electrode coupled to the second input terminal; and a fourth transistor having a first current electrode coupled to a second current electrode of the third transistor, a second current electrode coupled to the first output terminal, and a control electrode coupled to a first bias supply terminal by way of a first resistor. The first transistor may be formed in a first isolation well coupled to a second bias voltage supply terminal by way of a second resistor, and the second transistor may be formed in a second isolation well connected directly to the second bias voltage supply terminal. The first circuit may be further coupled between a third input terminal and a second output terminal, the first circuit further includes a fifth transistor having a first current electrode coupled to the third input terminal, a second current electrode coupled to the second output terminal, and a control electrode coupled to receive the first control signal; and a sixth transistor having a first current electrode coupled to the second current electrode of the first transistor, a second current electrode coupled to the first current electrode of the fifth transistor, and a control electrode coupled to the first supply terminal by way of a second resistor. The second circuit may be further coupled between a fourth input terminal and the second output terminal, the second circuit further includes a seventh transistor having a first current electrode coupled at the first supply terminal and a control electrode coupled to the fourth input terminal; and an eighth transistor having a first current electrode coupled to a second current electrode of the seventh transistor, a second current electrode coupled to the second output terminal, and a control electrode coupled to the control electrode of the fourth transistor.

By now it should be appreciated that there has been provided, an RF multiplexer circuit with high isolation and low impedance. The multiplexer circuit includes a first circuit portion and a second circuit portion coupled to a common output terminal pair. When the first circuit is enabled, the second circuit is disabled and a differential signal coupled at the input of the first circuit is transferred to the output terminal pair as a first differential output signal. When the second circuit is enabled, the first circuit is disabled and a differential signal coupled at the input of the second circuit is amplified as the signal is transferred to the output terminal pair as a second differential output signal. The second circuit is configured to generate the second differential output signal to have a predetermined gain higher than the gain of the first differential output signal. A network of shunt transistors in the first circuit are configured to short leakage signals to ground and improve isolation when the first circuit is disabled.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multiplexer comprising:
a first circuit coupled between a first input terminal and a first output terminal, the first circuit configured and arranged to transfer a first radio frequency (RF) signal coupled at the first input terminal to the first output terminal as a first output signal when a first control signal is at a first logic value, the first circuit comprising:
a first transistor having a first current electrode coupled to the first input terminal, a second current electrode coupled to the first output terminal, and a control electrode coupled to receive the first control signal, and
a second transistor having a first current electrode coupled to the second current electrode of the first transistor, a second current electrode coupled at a first supply terminal, and a control electrode coupled to receive a second control signal, the second control signal a complementary signal of the first control signal; and
a second circuit coupled between a second input terminal and the first output terminal, the second circuit configured and arranged to transfer a second RF signal coupled at the second input terminal to the first output terminal as a second output signal when the first control signal is at a second logic value, the second output signal having a gain higher than the gain of the second RF signal.

2. The multiplexer of claim 1, wherein the first transistor is formed in a first isolation well coupled to a first bias voltage supply terminal by way of a resistor, and wherein the second transistor is formed in a second isolation well connected directly to the first bias voltage supply terminal.

3. The multiplexer of claim 1, wherein the first circuit further comprises:
a first capacitor having a first terminal connected to the first input terminal and second terminal connected to the first current electrode of the first transistor; and
a second capacitor having a first terminal connected to the second current electrode of the first transistor and second terminal connected to the first output terminal.

4. The multiplexer of claim 1, wherein the second circuit comprises:
a third transistor having a first current electrode coupled at the first supply terminal and a control electrode coupled to the second input terminal; and
a fourth transistor having a first current electrode coupled to a second current electrode of the third transistor, a second current electrode coupled to the first output terminal, and a control electrode coupled to a second bias supply terminal by way of a resistor.

5. The multiplexer of claim 4, wherein the second circuit further comprises:
a first capacitor having a first terminal connected to the second input terminal and second terminal connected to the control electrode of the third transistor; and
a first resistor having a first terminal connected to the control electrode of the third transistor and a second terminal connected to a third bias supply terminal.

6. The multiplexer of claim 4, wherein the second circuit further comprises:
a first inductor having a first terminal connected to the second current electrode of the fourth transistor and second terminal connected to a second supply terminal.

7. The multiplexer of claim 4, wherein the second circuit further comprises:
a fifth transistor having a first current electrode coupled to the control electrode of the third transistor, a second current electrode coupled at the first supply terminal, and a control electrode coupled to receive the first control signal.

8. The multiplexer of claim 1, wherein:
the first circuit is further coupled between a third input terminal and a second output terminal, the first circuit further configured and arranged to transfer a third RF signal coupled at the third input terminal to the second output terminal as a third output signal when the first control signal is at the first logic value, the first RF signal and the third RF signal together are characterized as a first differential signal and the first output signal and the third output signal together are characterized as a first differential output signal; and
the second circuit is further coupled between a fourth input terminal and the second output terminal, the second circuit further configured and arranged to transfer a fourth RF signal coupled at the fourth input terminal to the second output terminal as a fourth output signal when the first control signal is at the second logic value, the fourth output signal having a gain higher than the gain of the fourth RF signal, the second RF signal and the fourth RF signal together are characterized as a second differential signal and the second output signal and the fourth output signal together are characterized as a second differential output signal.

9. A multiplexer comprising:
a first circuit coupled between a first input terminal and a first output terminal, the first circuit comprising:
a first transistor having a first current electrode coupled to the first input terminal, a second current electrode coupled to the first output terminal, and a control electrode coupled to receive a first control signal; and
a second transistor having a first current electrode coupled to the second current electrode of the first transistor, a second current electrode coupled at a first supply terminal, and a control electrode coupled to receive a second control signal, the second control signal a complementary signal of the first control signal; and
a second circuit coupled between a second input terminal and the first output terminal, the second circuit comprising:
a third transistor having a first current electrode coupled at the first supply terminal and a control electrode coupled to the second input terminal; and
a fourth transistor having a first current electrode coupled to a second current electrode of the third transistor, a second current electrode coupled to the first output terminal, and a control electrode coupled to a first bias supply terminal by way of a first resistor.

10. The multiplexer of claim 9, wherein the first circuit further comprises:
a first capacitor having a first terminal connected to the first input terminal and second terminal connected to the first current electrode of the first transistor; and
a second capacitor having a first terminal connected to the second current electrode of the first transistor and second terminal connected to the first output terminal.

11. The multiplexer of claim 9, wherein the second circuit further comprises:
a first capacitor having a first terminal connected to the second input terminal and second terminal connected to the control electrode of the third transistor; and
a second resistor having a first terminal connected to the control electrode of the third transistor and a second terminal connected to a second bias supply terminal.

12. The multiplexer of claim 11, wherein the second circuit is further coupled between a fourth input terminal and the second output terminal, the second circuit further comprises:
a seventh transistor having a first current electrode coupled at the first supply terminal and a control electrode coupled to the fourth input terminal; and
an eighth transistor having a first current electrode coupled to a second current electrode of the seventh transistor, a second current electrode coupled to the second output terminal, and a control electrode coupled to the control electrode of the fourth transistor.

13. The multiplexer of claim 9, wherein the second circuit further comprises:
a first inductor having a first terminal connected to the second current electrode of the fourth transistor and second terminal connected to a second supply terminal.

14. The multiplexer of claim 9, wherein the first circuit is further coupled between a third input terminal and a second output terminal, the first circuit further comprises:
a fifth transistor having a first current electrode coupled to the third input terminal, a second current electrode coupled to the second output terminal, and a control electrode coupled to receive the first control signal; and
a sixth transistor having a first current electrode coupled to the second current electrode of the first transistor, a second current electrode coupled to the first current electrode of the fifth transistor, and a control electrode coupled to the first supply terminal by way of a second resistor.

15. The multiplexer of claim 9, wherein the first transistor is formed in a first isolation well coupled to a second bias voltage supply terminal by way of a second resistor, and wherein the second transistor is formed in a second isolation well connected directly to the second bias voltage supply terminal.

16. A multiplexer comprising:
a first circuit comprising:
a first transistor having a first current electrode coupled to a first input terminal, a second current electrode coupled to a first output terminal, and a control electrode coupled to receive a first control signal; and
a second transistor having a first current electrode coupled to the second current electrode of the first transistor, a second current electrode coupled at a first supply terminal, and a control electrode coupled to receive a second control signal, the second control signal a complementary signal of the first control signal; and
a second circuit configured to transfer an RF signal coupled at a second input terminal to the first output terminal as an output signal having a gain higher than the gain of the RF signal based on the first control signal, the second circuit comprising:
a third transistor having a first current electrode coupled at the first supply terminal and a control electrode coupled to the second input terminal; and
a fourth transistor having a first current electrode coupled to a second current electrode of the third transistor, a second current electrode coupled to the first output terminal, and a control electrode coupled to a first bias supply terminal by way of a first resistor.

17. The multiplexer of claim 16, wherein the first transistor is formed in a first isolation well coupled to a second bias voltage supply terminal by way of a second resistor, and wherein the second transistor is formed in a second isolation well connected directly to the second bias voltage supply terminal.

18. The multiplexer of claim 16, wherein the first circuit is further coupled between a third input terminal and a second output terminal, the first circuit further comprises:
a fifth transistor having a first current electrode coupled to the third input terminal, a second current electrode coupled to the second output terminal, and a control electrode coupled to receive the first control signal; and
a sixth transistor having a first current electrode coupled to the second current electrode of the first transistor, a second current electrode coupled to the first current electrode of the fifth transistor, and a control electrode coupled to the first supply terminal by way of a second resistor.

19. The multiplexer of claim 18, wherein the second circuit is further coupled between a fourth input terminal and the second output terminal, the second circuit further comprises:
a seventh transistor having a first current electrode coupled at the first supply terminal and a control electrode coupled to the fourth input terminal; and
an eighth transistor having a first current electrode coupled to a second current electrode of the seventh transistor, a second current electrode coupled to the second output terminal, and a control electrode coupled to the control electrode of the fourth transistor.

20. A multiplexer comprising:
a first circuit coupled between a first input terminal and a first output terminal, the first circuit configured and arranged to transfer a first radio frequency (RF) signal coupled at the first input terminal to the first output terminal as a first output signal when a first control signal is at a first logic value; and
a second circuit coupled between a second input terminal and the first output terminal, the second circuit configured and arranged to transfer a second RF signal coupled at the second input terminal to the first output terminal as a second output signal when the first control signal is at a second logic value, the second output signal having a gain higher than the gain of the second RF signal;
wherein the first circuit is further coupled between a third input terminal and a second output terminal, the first circuit further configured and arranged to transfer a third RF signal coupled at the third input terminal to the second output terminal as a third output signal when the first control signal is at the first logic value, the first RF signal and the third RF signal together are characterized as a first differential signal and the first output signal and the third output signal together are characterized as a first differential output signal; and
wherein the second circuit is further coupled between a fourth input terminal and the second output terminal, the second circuit further configured and arranged to transfer a fourth RF signal coupled at the fourth input terminal to the second output terminal as a fourth output signal when the first control signal is at the second logic value, the fourth output signal having a gain higher than the gain of the fourth RF signal, the second RF signal and the fourth RF signal together are characterized as a second differential signal and the second output signal and the fourth output signal together are characterized as a second differential output signal.

* * * * *